United States Patent
Ishitani et al.

(10) Patent No.: US 6,734,687 B1
(45) Date of Patent: May 11, 2004

(54) APPARATUS FOR DETECTING DEFECT IN DEVICE AND METHOD OF DETECTING DEFECT

(75) Inventors: Tohru Ishitani, Hitachinaka (JP); Hidemi Koike, Hitachinaka (JP); Aritoshi Sugimoto, Tokyo (JP); Isamu Sekihara, Fussa (JP); Kaoru Umemura, Musashino (JP); Satoshi Tomimatsu, Kokubunji (JP); Junzo Azuma, Hitachiota (JP)

(73) Assignees: Hitachi, Ltd., Tokyo (JP); Hitachi ULSI Systems, Co., Ltd., Tokyo (JP)

( * ) Notice: Subject to any disclaimer, the term of this patent is extended or adjusted under 35 U.S.C. 154(b) by 0 days.

(21) Appl. No.: 09/936,941
(22) PCT Filed: Feb. 25, 2000
(86) PCT No.: PCT/JP00/01108
§ 371 (c)(1), (2), (4) Date: Dec. 4, 2001
(87) PCT Pub. No.: WO01/63660
PCT Pub. Date: Aug. 30, 2001

(51) Int. Cl.[7] .................... G01R 31/302; G01R 31/305; G01R 31/02
(52) U.S. Cl. .................... 324/751; 324/750; 324/758
(58) Field of Search .................... 324/750, 751, 324/754, 758, 759

(56) References Cited

U.S. PATENT DOCUMENTS

| | | | |
|---|---|---|---|
| 4,267,507 A | 5/1981 | Guerpont | 324/158 |
| 4,740,698 A | * 4/1988 | Tamura et al. | 250/310 |
| 5,469,064 A | 11/1995 | Kerschner et al. | 324/537 |
| 5,844,416 A | * 12/1998 | Campbell et al. | 324/750 |
| 5,850,146 A | 12/1998 | Shim et al. | 324/761 |
| 6,331,712 B1 | * 12/2001 | Sugiyama et al. | 250/492.21 |
| 6,452,174 B1 | * 9/2002 | Hirose et al. | 250/309 |

FOREIGN PATENT DOCUMENTS

| | | |
|---|---|---|
| JP | 55-9407 | 1/1980 |
| JP | 1-143983 | 6/1989 |
| JP | 2-102467 | 4/1990 |
| JP | 4-74437 | 6/1992 |
| JP | 4-343245 | 11/1992 |
| JP | 9-326425 | 12/1997 |
| JP | 10-313027 | 11/1998 |
| JP | 11-121559 | 4/1999 |

* cited by examiner

*Primary Examiner*—N. Le
*Assistant Examiner*—John Teresinski
(74) *Attorney, Agent, or Firm*—Dickstein Shapiro Morin & Oshinsky LLP

(57) ABSTRACT

Disconnection defects, short-circuit defects and the like in wiring patters of submicron sizes within TEGs (a square of 1 to 2.5 mm for each) numerously arranged in a large chip (a square of 20 to 25 mm) can be inspected with respect to all the TEGs, with good operability, high reliability and high efficiency. A conductor probe for applying voltage to the wiring patterns by mechanical contact is composed of synchronous type conductor probe that synchronizes with movement of a sample stage (16), and fixed type conductor probe means (21) that is relatively fixed to an FIB generator (10). Positions of probe tips are superimposed to an SIM image and displayed on a display unit (19).

10 Claims, 9 Drawing Sheets

APPARATUS FOR DETECTING DEFECT IN DEVICE AND METHOD OF DETECTING DEFECT

BACKGROUND OF THE INVENTION

1. Technical Field

The present invention relates to an apparatus for inspecting defects of devices and a method of inspecting defects, in particular, to an apparatus for inspecting defects of devices useful for detecting defects of disconnection and short circuits of electric wiring and a method of inspecting defects.

2. Description of the Prior Art

A manufacturing process of a semiconductor is composed of iteration of serial processes such as exposure, etching, film forming and doping. Depending on maturity of a manufacturing process used, defect (form defects and electrical defects) inspection and dimension measurement are carried out between processes. From a viewpoint of early start-up of the manufacturing process, it is necessary to feed back the data from these inspection apparatuses and measuring apparatuses promptly to the manufacturing process. As for form inspection apparatuses for inspecting foreign particles on a device or abnormal forms thereof, there are optical microscopes and scanning electron microscopes. On the other hand, as for inspection apparatuses for electric defects such as disconnection and short circuits of wiring in a device, there are scanning electron microscopes (hereinafter referred to as "SEM") and inspection apparatuses utilizing voltage contrasts in images from scanning ion microscopes (hereinafter referred to as "SIM"). The latter inspection apparatuses using an electron beam or a focused ion beam (hereinafter referred to as "FIB") are disclosed, for example, in Japanese Patent Laid-Open Publications Hei 9 (1997)-326425, Hei 10 (1998)-313027 and Hei 11 (1999)-121559.

In a voltage contrast image, a voltage on a component forming the image determines luminance of the component in the image. Such voltage on the component may be applied thereto with a mechanical probe (a conductor probe) or by bestowment of electric charges from the scanning beam itself. In the latter case, since floating conductors (such as wiring) are charged slightly positive, they seem dark or drab in the case of observing SIM images with an optimized inspection apparatus. On the contrary, since electric charges are not stored in grounded conductors, they are observed as images of the same brightness. Moreover, in order to optimize detecting capability of voltage contrasts, also known is provision of filter mesh in which bias electric potential is applied between a sample and a secondary electron detector.

Either a conductor probe which is loaded on a sample stage and moves synchronously with the sample stage (hereinafter referred to as a "sample stage synchronous type conductor probe"), or a conductor probe which is fixed (to a ceiling face of a sample chamber, for example,) relatively with respect to an FIB generator (hereinafter referred to as a "fixed type conductor probe") is adopted as the conductor probe of a conventional inspection apparatus.

Although a chip size of a silicon integrated circuit changes along with its generation, the chip size of the current generation and the next generation is a square of about 20 to 25 mm, in the meantime, one unit size of a test element group (TEG) thereof is a square of about 1 to 2.5 mm, and a minimum width of wiring thereof is 0.1 to 0.5 $\mu$m. Here, the TEG refers to a test element group for monitoring characteristic values and manufacturing processes of various elements such as transistors, capacitors, resistors and wiring. Meanwhile, in defect observation of TEG pattern wiring of 0.1 $\mu$m level with a conventional FIB apparatus, for example, when 0.1 $\mu$m is allotted to 4 pixels in an SIM image, then a visual field of a 1024×1024 pixel SIM image is equivalent to a square of about 26 $\mu$m. Such a size is 1/40 to 1/200 as small as one TEG unit size that is a square of 1 to 2.5 mm. However, operability will be improved if a visual field of an SIM image at a minimum magnification can almost cover a full range of the one TEG unit by combination of a beam shift function that shifts an original point of the visual filed of the SIM image. Nevertheless, even if coverage of the one TEG unit being the square of 1 to 2.5 mm is achieved, it is yet impossible to observe SIM images of circuit wiring patterns of all TEGs formed within one chip without moving the sample stage.

The conductor probe in the conventional inspection apparatus is either the sample stage synchronous type conductor probe that is loaded on the sample stage and moves synchronously with the sample stage, or the fixed type conductor probe that is relatively fixed with respect to the FIB generator. In general, there is a tendency that accuracies of moving positions become worse as a moving range of a tip of the conductor probe becomes wider. For this reason, a conductor probe that satisfies both wide-range moving across an entire surface of one chip (a square of about 20 to 25 mm) and high-accuracy moving positions within a visual filed of an SIM image at the minimum magnification (a square of 1 to 2.5 mm) had been yet to be found.

In consideration of the above-described problem of the prior art, an object of the present invention is to provide an apparatus for inspecting defects of devices that satisfies the demand for both wide-range moving and high-accuracy positioning moving within a narrow range and that improves usability of a conductor probe thereof for achieving higher inspection efficiency, and a method of inspecting defects.

SUMMARY OF THE INVENTION

According to the present invention, firstly, electric charges are supplied to a device (a semiconductor chip, for example) in such a manner that an electrically isolated component (wiring, for example) thereof has a different voltage from an electrically grounded component (a substrate, for example) thereof (Step 1). Next, voltage contrast data of the chip including the above-described components are obtained by use of an SIM image (Step 2). Lastly, any component showing a voltage different from a predetermined voltage with respect to such component is detected by analyzing the voltage contrast data (Step 3). In Step 1, supply of the electric charges occurs in the course of irradiating the FIB itself for SIM image observation, or a conductor probe using mechanical contact may be also used. Moreover, the conductor probe that effectuates mechanical contact with a floating conductor can remove the electric charges supplied by the FIB irradiation down to specified electric potential or additionally supply the electric charges. Thus, various control of the electric potential becomes feasible in comparison with the case using just the FIB, whereby high reliability upon defect inspection by the voltage contrast analysis is brought about. The conductor probe is combined with a conductor probe movement mechanism for moving the conductor probe, thus constituting conductor probe means.

An apparatus for inspecting defects of devices according to the present invention includes a plurality of conductor probe means, a part of which is conductor probe means of a movable type that moves synchronously with movement of a sample stage, and the remainder is conductor probe means of an immovable type that is relatively fixed with respect to a focused ion beam generator and does not move when the sample stage is moved.

Movement of visual field positions of SIM image observation is carried out only by beam shifting when a destination of the movement is located within an SIM image visual field of low magnification when an amount of beam shifting is set to zero (normally a square of several hundred micrometers). When the destination is located outside the visual field, the movement is carried out in a combination of large movement by the sample stage and fine movement by the beam shifting.

In an image display unit, besides an SIM observation image A of a sample surface, an inspection area image B that exhibits an inspection area of the sample is also displayed. Also, a visual field position of the SIM observation image A and tip positions of the conductor probes are superimposed on the inspection area image B. Moreover, display of the tip position of the conductor probes also bears status information as whether those probe tips are allowed to contact with the sample. When an operator wishes to move the observation visual field of the SIM observation image A or the tips of the conductor probes on the inspection area image B, provided is means for such operation by severally designating destinations. Furthermore, by linking a specific tip of a conductor probe with a central position of visual field of the SIM image, provided is link movement means where the tip of the conductor probe is allowed to move toward a position within a visual field of destination upon movement of such visual field of the SIM image.

Specifically, an apparatus for inspecting defects of devices according to the present invention is an apparatus for inspecting defects of devices including: a sample chamber; a movable sample stage for holding a device sample inside the sample chamber; a focused ion beam generator for irradiating a focused ion beam on the sample held on the sample stage; a charged particle detector for detecting secondary charged particles generated from the sample by irradiation of the focused ion beam; an image display unit for displaying an observation image A in which detected intensity of the secondary charged particles is converted into luminance signals; and a plurality of conductor probe means having conductor probes for contacting with the sample and conductor probe movement mechanisms for moving the conductor probes, wherein the conductor probe means includes: conductor probe means being fixed relatively with respect to the focused ion beam generator; and conductor probe means being fixed relatively with respect to the sample stage.

The conductor probe means fixed relatively with respect to the focused ion beam generator can move a tip of the conductor probe in higher positioning accuracy than the conductor probe means fixed relatively with respect to the sample stage. A moving range of the tip of the conductor probe is smaller in the conductor probe means fixed relatively with respect to the focused ion beam generator than in the conductor probe means fixed relatively with respect to the sample stage.

The conductor probe movement mechanism for the conductor probe means fixed relatively with respect to the focused ion beam generator can be fixed to a sidewall face of the sample chamber, a ceiling face thereof, or the focused ion beam generator. The conductor probe movement mechanism for the conductor probe means fixed relatively with respect to the sample stage can be fixed to the sample stage.

Moreover, it is preferable that the apparatus for inspecting defects of devices has a function of invariably locating the tip of the conductor probe of the conductor probe means fixed relatively with respect to the focused ion beam generator within a visual field of the observation image A.

It is preferable that the display unit displays an inspection area image B that indicates positions of the tips of the conductor probes on the sample. In this event, it is preferable that mechanical contact and non-contact of the tips of the conductor probes with the sample are also displayed in the inspection area image B. Moreover, a state of spatial interference among the plurality of conductor probes may be also displayed in the inspection area image B.

A method of inspecting defects in devices according to the present invention including the steps of allowing a tip of a conductor probe to contact with a point of voltage application on a device sample being held on a sample stage, irradiating a focused ion beam from a focused ion beam generator to the sample in a state that voltage is applied from the conductor probe to the sample, and detecting wiring defects based on voltage contrasts in an image taken with a scanning ion microscope by detecting secondary charged particles generated from the sample, which is characterized in that voltage application is carried out from the conductor probe held in a position fixed relatively with respect to the focused ion beam generator to a voltage application point of a sample necessary to be changed in relation with movement of a visual field of the scanning ion microscope, and that voltage application is carried out from the conductor probe held at the sample stage to a voltage application point of a sample not to be changed necessarily in relation with the movement of the visual field of the scanning ion microscope.

The movement of the visual field of the scanning ion microscope is carried out either by a sample stage movement or a beam shifting function. The voltage application point of the sample necessary to be changed in relation with the movement of the visual field of the scanning ion microscope refers generally to a voltage application point for confirmation of a defect, and it is typically set on fine patterns. The voltage application point of the sample not to be changed necessarily in relation with the movement of the visual field of the scanning ion microscope refers to a point for applying voltage on TEG patterns, such as a pad portion of wiring. The voltage application point in this case is not changed synchronously with the visual field of the scanning ion microscope during inspection of one TEG, however, it is necessary to change upon inspection of another TEG.

It is preferable that the tip of the conductor probe held in the position fixed relatively with respect to the focused ion beam generator is allowed to move as linked with the visual field of the scanning ion microscope.

Moreover, the position of the tip of the conductor probe can be displayed as a mark superimposed on a scanning ion microscopic image, and the displayed position of the mark can be moved relative to the scanning ion microscopic image so that the position of the tip of the conductor probe is moved corresponding to the movement. Such movement of the displayed position of the mark relevant to the scanning ion microscopic image can be performed by operating the mark by use of a pointing device such as a mouse.

According to the present invention, by the FIB scanning a device subject to inspection such as a semiconductor integrated circuit chip and applying desired electric potential while allowing the conductor probe to mechanically contact with an arbitrary position of a wiring portion on the chip, an SIM image of the chip is formed and defects such as disconnection or short circuits of the wiring can be detected with high reliability by analyzing electric potential contrasts thereof In particular, a plurality of the conductor probes are provided and at least one of them is a sample stage synchronous type conductor probe that is movable synchronously with the sample stage, while others are fixed type conductor probes being fixed relatively with respect to the focused ion beam generator. Accordingly, regarding one chip (a square of 20 to 25 mm) arranged with numerous TEGs (a square of 1 to 2.5 mm each), defects such as disconnection of wiring patterns in submicron sizes and short-circuit defects of the wiring patterns can be inspected over an entire region of the chip (regarding all the TEGs), with good operability, high efficiency and high reliability.

DETAILED DESCRIPTION OF THE PREFERRED EMBODIMENT

Now, the present invention will be described in detail with reference to the accompanying drawings.

Figure 1:
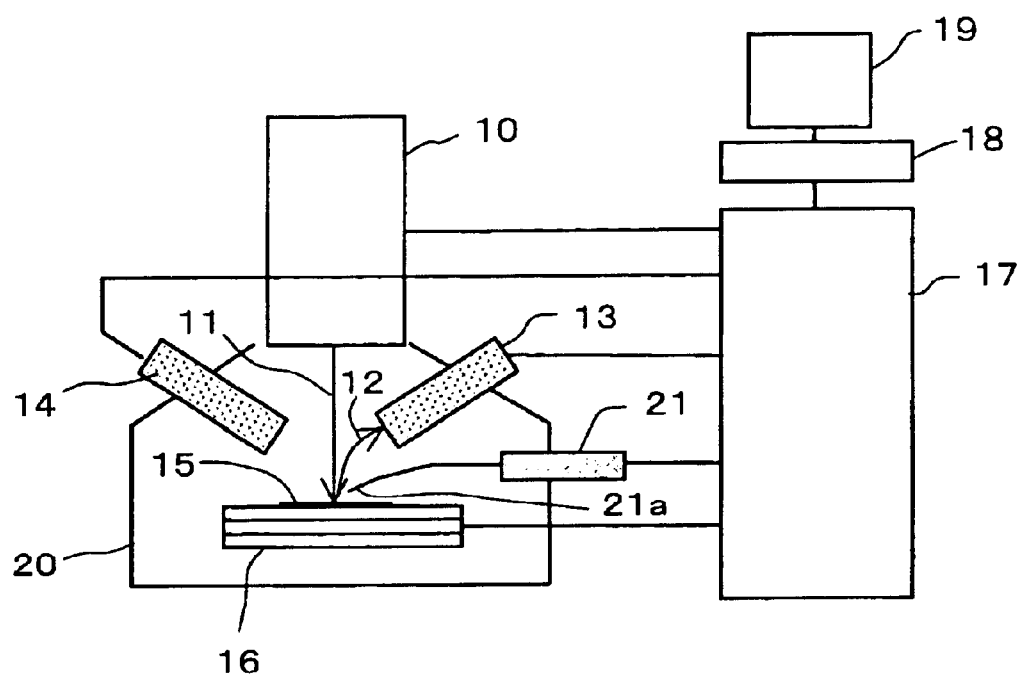
FIG. 1 is a schematic constitutional view of an apparatus for inspecting defects of devices according to the present invention.
Figure 2:
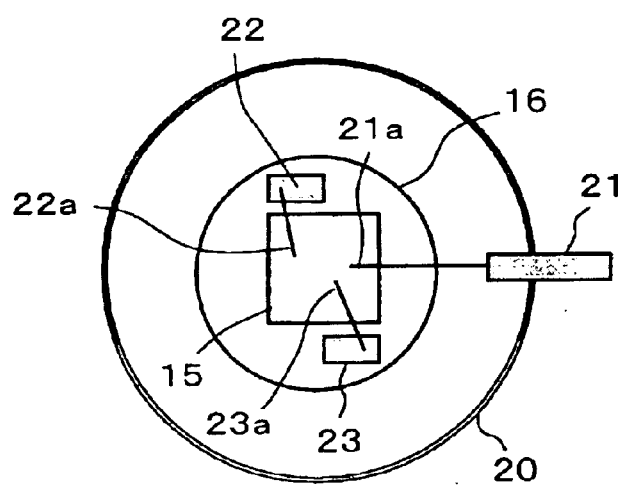
FIG. 2 is a schematic top plan view of an inside of a sample chamber of the apparatus shown in FIG. 1 viewed from a direction of an FIB axis.

FIG. 1 is a schematic constitutional view of an apparatus for inspecting defects of devices according to the present invention, and FIG. 2 is a schematic top plan view of a sample 15, a sample stage 16 and conductor probe means 21, 22 and 23 inside a sample chamber of the apparatus for inspecting defects of devices shown in FIG. 1, viewed from a direction of an FIB axis. An FIB generator 10 generates an FIB 11 by drawing ions out of a gallium liquid metal ion source and focusing the ions by acceleration to 30 kV. An electric current of the FIB is in a range from about 1 pA to 20 nA. Normally, the electric current in a range from 1 pA to 100 pA is used for observation of an SIM image of defects; the electric current at several tens of picoamperes is used for conductive film deposition by the FIB assist; and the electric current in a range from several tens of picoamperes to 20 nA is used for section processing or bore processing. The FIB 11 is irradiated to the sample chip 15, and secondary electrons 12, which are the most frequent among secondary charged particles emitted from the sample, are detected by a charged particle detector 13. The sample 15 is loaded on the sample stage 1, and it is movable along a plane perpendicular to the FIB axis (taken as the z axis), i.e. along the x-y plane.

Figure 3:
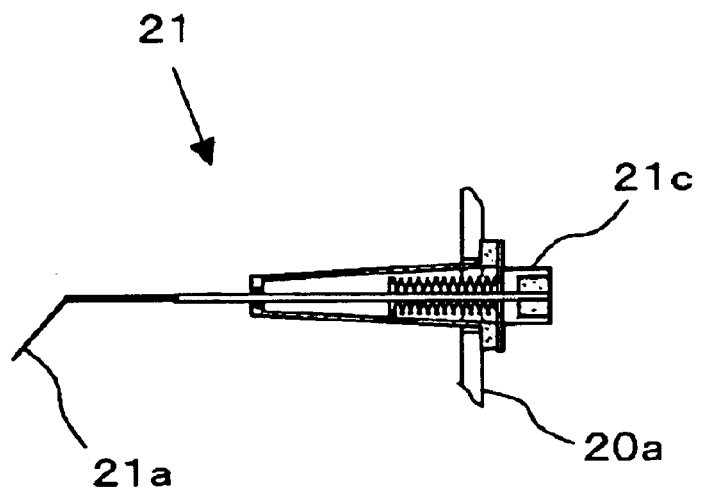
FIG. 3 is a schematic view showing an example of fixed type conductor probe means being fixed to a sidewall face of the sample chamber.
Figure 4:
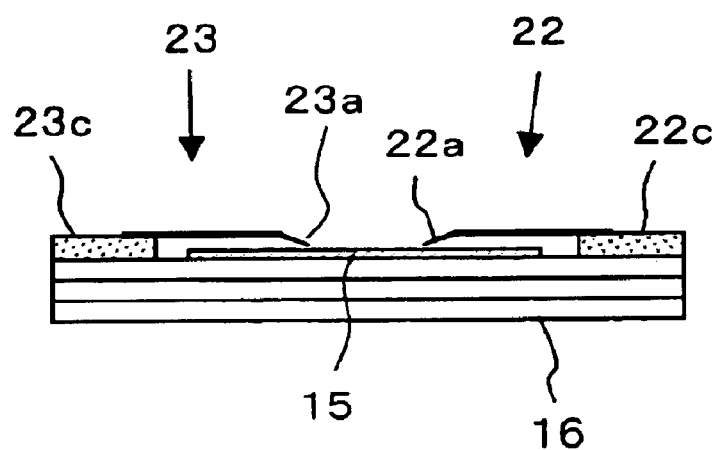
FIG. 4 is a schematic view showing an example of sample stage synchronous type conductor probe means loaded on a sample stage.

The conductor probe means 21, 22 and 23 for applying electric potential by mechanical contact with the sample are disposed around the sample 15. Among them, the conductor probe means 21 is fixed type conductor probe means that is fixed to a position without movement relatively with respect to the FIB generator; here it is fixed to a sidewall face 20a of the sample chamber 20 as shown in FIG. 3. The conductor probe means 21 can control movement of a tip portion 21a of a conductor probe toward x, y and z directions with a conductor probe movement mechanism 21c. A maximum domain of x-y movement is equivalent to a maximum scanning visual field of the FIB, which is coverage of a square of about 2 mm in the example described herein. The remaining conductor probe means 22 and 23 is sample stage synchronous type conductor probe means that is loaded on the sample stage 16, as shown in FIG. 4. Tip portions of conductor probes 22a and 23a of the conductor probe means 22 and 23 can be controlled to move toward the x, y and z directions by conductor probe movement mechanisms 22c and 23c, respectively.

The FIB generator 10, the charged particle detector 13, the sample stage 16 and the conductor probe means 21, 22 and 23 are severally controlled by a computer 18 via a control unit 17. Moreover, a gas gun 14 for FIB-assistive deposition that performs partial conductor thin film forming on a surface of the sample is also connected to the control unit 17. Connected to the computer 18 is an image display unit 19 such as a CRT for displaying a scanning secondary electron image A and displaying a position image B for a position of FIB irradiation and a position of the tip portions of the conductor probes.

Figure 5:
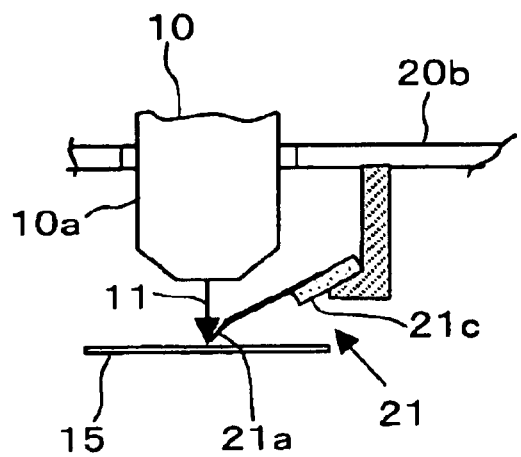
FIG. 5 is a schematic view showing an example of the fixed type conductor probe means being fixed to a ceiling face of the sample chamber.
Figure 6:
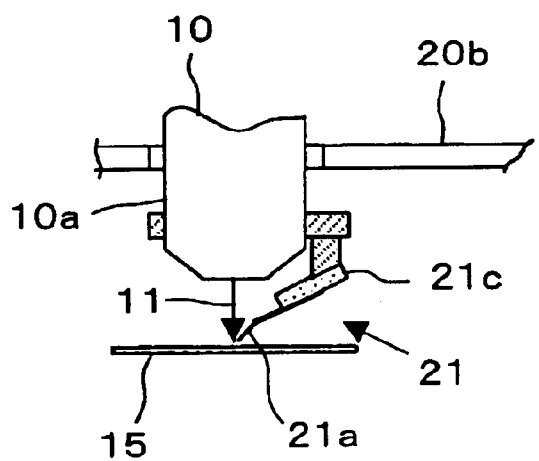
FIG. 6 is a schematic view showing an example of the fixed type conductor probe means being fixed to an under face of a focused ion beam generator.

Although description was made above regarding an example of fixing the fixed type conductor probe means 21 to the sidewall face 20a of the sample chamber 20, the fixed type conductor probe means 21 may be fixed to a ceiling face 20b of the sample chamber 20 as shown in FIG. 5, or it may be fixed to an under face 10a of the focused ion beam generator 10 as shown in FIG. 6. The mode as shown in FIG. 3, in which the fixed type conductor probe means 21 is fixed to the sidewall face 20a of the sample chamber 20, is easier to detach from the fixing object in comparison with the modes of fixation to the ceiling face 20b shown in FIG. 5 or to the under face 10a of the focused ion beam generator 10 shown in FIG. 6, therefore it is convenient for maintenance. On the other hand, the mode of fixation to the focused ion beam generator 10 shown in FIG. 6 has a characteristic of high accuracy in positioning the tip of the conductor probe because the mode has a shorter distance from the synchronous type conductor probe movement mechanism 21c to a surface of the sample in comparison with the other modes, and a length of the conductor probe can be shortened so that swing of the conductor probe can be reduced.

Figure 7:
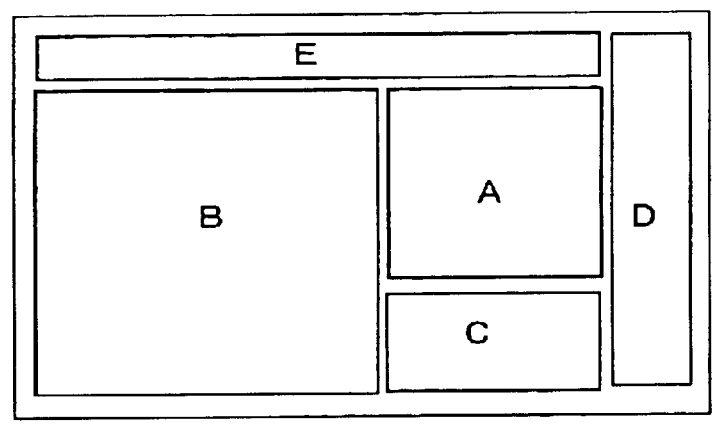
FIG. 7 is an explanatory drawing showing one example of a CRT display screen, which is an image display unit.

FIG. 7 is an explanatory drawing of one example of a CRT screen, which is an image display unit 19. As shown in FIG. 7, on a CRT screen 19a displayed are: an SIM image A for monitoring; an inspection area image B for displaying a position of the tip portion of the conductor probe and an inspective visual field frame of the SIM image for monitoring; a graph window C for showing y or x line distribution of intensity of the SIM image at a certain x or y position; a display window D for ion acceleration voltage, focusing lens voltage, beam narrowing, beam currents, acquisition conditions for the SIM image and the like, which are to be controlled by the FIB generator or the like; a menu bar E for drawing various control windows; and the like. A navigation image F regarding sample stage movement is also equipped, and displaying a window of the image F can be executed by drawing it out of the menu bar E.

Figure 8:
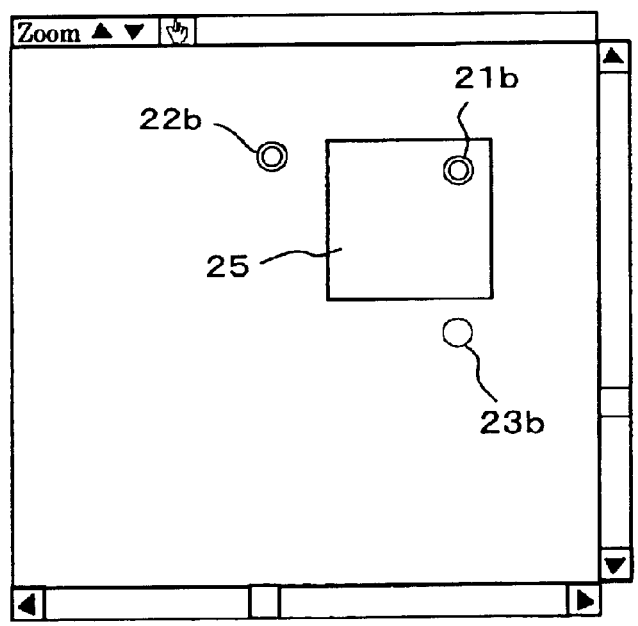
FIG. 8 is an explanatory drawing showing a display example of an inspection area image B.

Next, detail description will be made regarding the inspection area image B by use of FIG. 8. As a base image for the inspection area image B, a recorded image of an SIM image of that inspection area is used. On an outer frame of a display window for the inspection area image B, attached are a button for zooming up and down the image, slide bars for sliding the zoomed-up image up and down or right and left as well as a button displayed as a hand mark for switching on and off a function to grab the image at an arbitrary point and to slide it up and down or right and left. Moreover, a plurality of display windows for the inspection area image B can be also displayed for allowing comparative reference of inspection area images of different magnifications. In the inspection area image B, marks 21b to 23b (◎ and ○) for indicating positions of the tip portions of the respective conductor probes 21a to 23a of the conductor probe means 21 to 23, and a rectangular frame 25 for indicating an area (its location and its size) of the visual field of the SIM image for monitoring, as overlapping the base image. The marks (◎ and ○) also distinguish states whether the tip portions of the conductor probes are contacted or not contacted with the surface of the sample. For example, the marks ◎ indicating the positions 21b and 22b of the tip portions of the conductor probes shown in FIG. 8 represent contact, and the mark ○ indicating the position 23b of the tip portion of the conductor probe represents non-contact. Moreover, display colors of the marks are made different in order to distinguish the plurality of the conductor probes.

Figure 9:
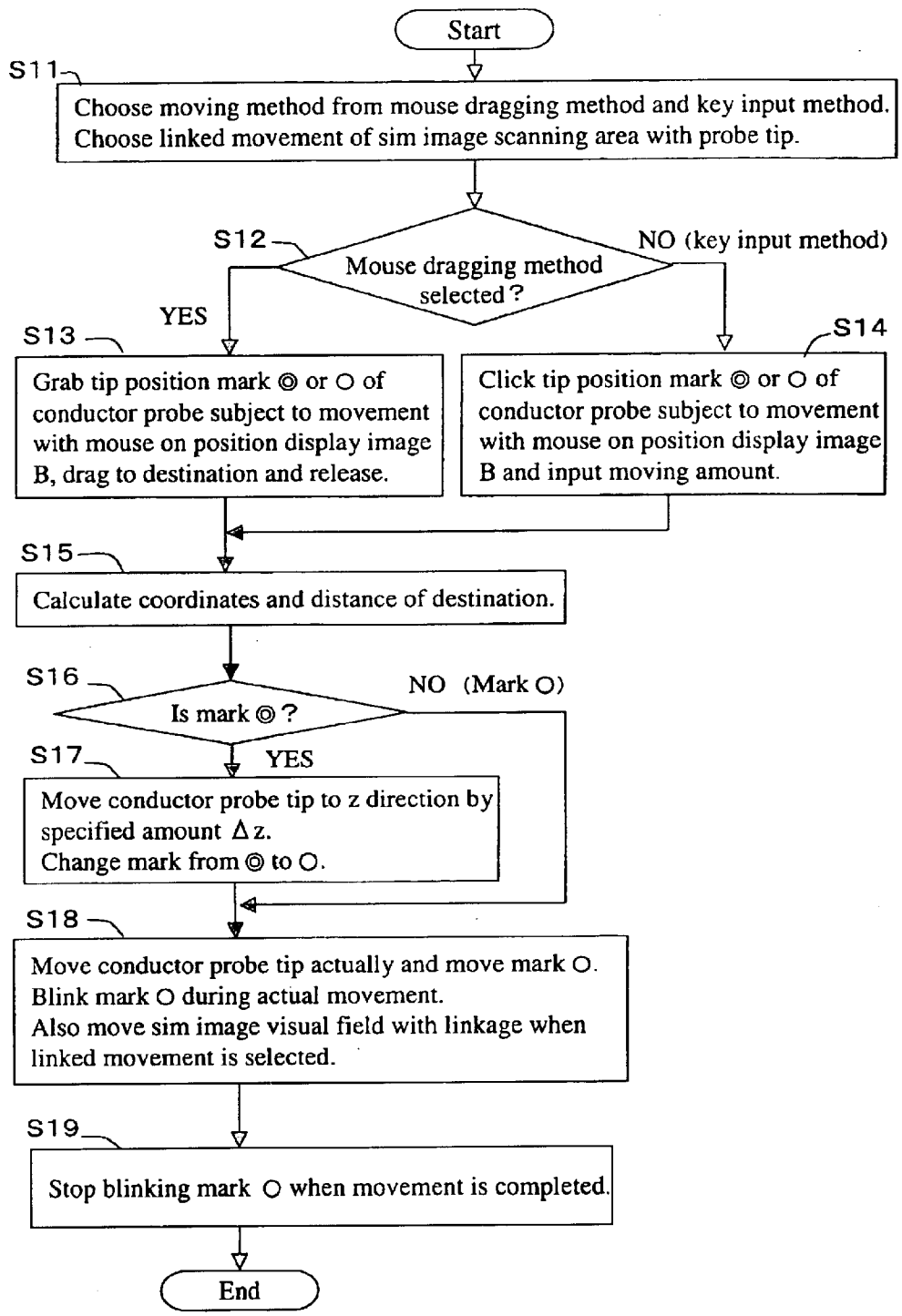
FIG. 9 is a flowchart showing a process of moving a position of a probe tip portion.

There are two methods, namely, a mouse dragging method and a key input method, for moving the positions of the tip portions of the conductor probe means on the inspection area image B to other specified positions. A process flowchart thereof is described in FIG. 9.

To begin with, a moving method is opted out of the mouse dragging method and the key input method. Moreover, an option is made as whether linked movement of the SIM image scanning area with the probe tips is adopted or not (S11). A link movement function refers to a function to allow movement of the visual field of the SIM image to link with movement of the tips of the conductor probes, and the function is for monitoring a state of the tips of the conductor probes during movement with the SIM image. Movement of the visual field of the SIM image will be described later.

Next, judgment is made as whether the moving method is the mouse dragging method or the key input method (S12). When the method is the mouse dragging method, the mark ◎ or ○ of the tip position of the conductor probe subject to movement in the position display image B is grabbed, and it is dragged to a destination and released. (S13). On the contrary, when the method is the key input method, the mark ◎ or ○ of the tip position of the conductor probe subject to movement in the position display image B is clicked with the mouse, and a quantity of movement of the selected conductor probe (x and y components of a moving distance; i.e. $\Delta x$ and $\Delta y$, or a moving distance $\Delta s$ and an azimuth angle for the destination $\theta$) is inputted with keys (S14).

Next, coordinates of the destination and the moving distance are calculated (S15). Subsequently, judgment is made as whether the mark of go the tip position of the conductor probe is ◎ that indicates the contact state or ○ that indicates the non-contact state (S16). When the mark is ◎, the tip of the conductor probe is moved by a certain amount $\Delta z$ to be the non-contact state, and the mark is changed from ◎ to ○ (S17). Thereafter, actual movement of the tip of the conductor probe and movement of the mark ○ is carried out. During actual movement, the mark ○ is displayed blinking. Moreover, when the link movement is selected, the visual field of the SIM image is also link moved (S18). Lastly, the mark ○ discontinues blinking after the movement is completed (S19). In the case when the mark is judged as ○ in S16, since the tip position of the conductor probe subject to movement is in the non-contact state, the process skips S17 and goes to S18, and then the same process is executed thereafter.

Movement of the visual field of the SIM image is also carried out in a similar manner to the mouse dragging method for the position of the probe tip portion, by means of grabbing the SIM image visual field frame 25 shown in FIG. 8 with the mouse, dragging it to a destination and releasing it, whereby beam shifting or a combination of beam shifting and movement of the sample stage is commanded by a control unit. Such movement is carried out only with beam shifting when the destination is located within a visual field of a low-magnification SIM image in which an amount of the beam shifting is set to zero (normally a square of several hundreds of micrometers). On the contrary, when the destination is located outside the visual field, the movement is carried out in a combination of large movement by the sample stage and fine movement by the beam shifting. Here, the reason for setting a restriction on the movement by beam shifting is that the SIM image is distorted when a deflection amount of beam scanning becomes large, therefore a sharp drop of accuracy in moving positions should be avoided.

In order to improve operability, information on sizes of the probe tips and directions thereof is linked and incorporated in a computer with information regarding the tip position marks 21b to 23b (◎ or ○) of the conductor probes 21a to 23a. In this way, when the tip portions of the probes approach too close such that it may cause spatial interference, presence of such interference is notified to an operator of the apparatus by allowing the position marks of the both to blink simultaneously and so on, and at the same time, a software restraint is provided in order not to allow the probes to approach any closer. In addition, movement navigation of the tips of the conductor probes is effectuated by position resolving power of a submicron level by use of the zooming up and zooming down function and the slide function of the inspection area image B. Moreover, for more improved efficiency of device inspection, circuit pattern arrangement data of a device subject to inspection may be obtained from a workstation (not shown), and a circuit pattern image is displayed as overlapping the position display image B through corrections of magnification and a rotation angle of the image by the computer 18. In this way, positions of underplayed wiring and elements that are buried can be estimated visually.

Next, one example of an inspection method of a wiring pattern TEG will be described by use of enlarged inspection area images B of FIG. 10 and FIG. 11. An SIM image of a device wiring pattern of a comb structure is used as a base image for the inspection area images B of this example, and a visual field frame 25 of the SIM image A for monitoring and the position marks 21b to 23b of the tip portions of the conductor probes are indicated thereon. Pads 26 and 27 which mechanical probes contact with for voltage application are also indicated thereon. Electric potential of a sample substrate is normally grounded, however, voltage can be applied thereto. Defected spots in the wiring pattern such as disconnection or short circuits can be detected by various combinations of application of electric potential to the pads 26 and 27 from 0 to several volts and by comparing SIM images of voltage contrasts in the events.

Figure 10:
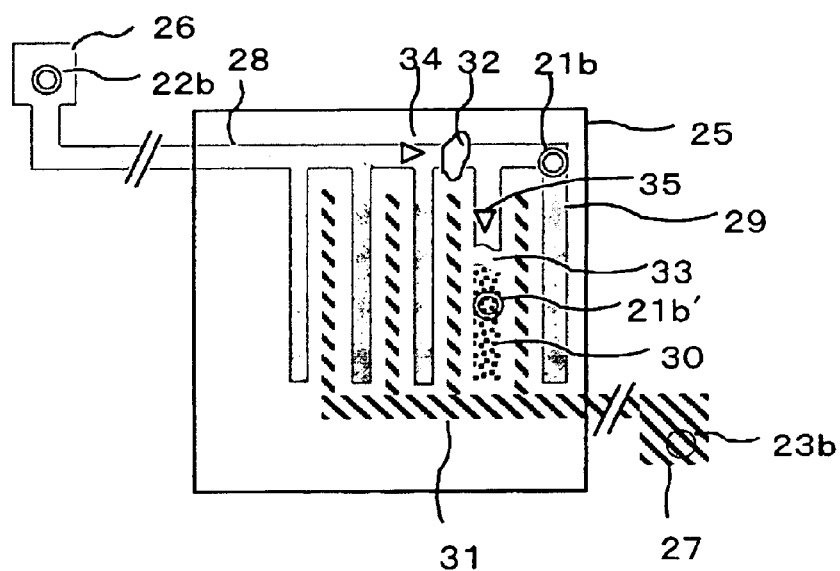
FIG. 10 is a view showing an example of a magnified inspection area image B of a wiring pattern TEG.
Figure 11:
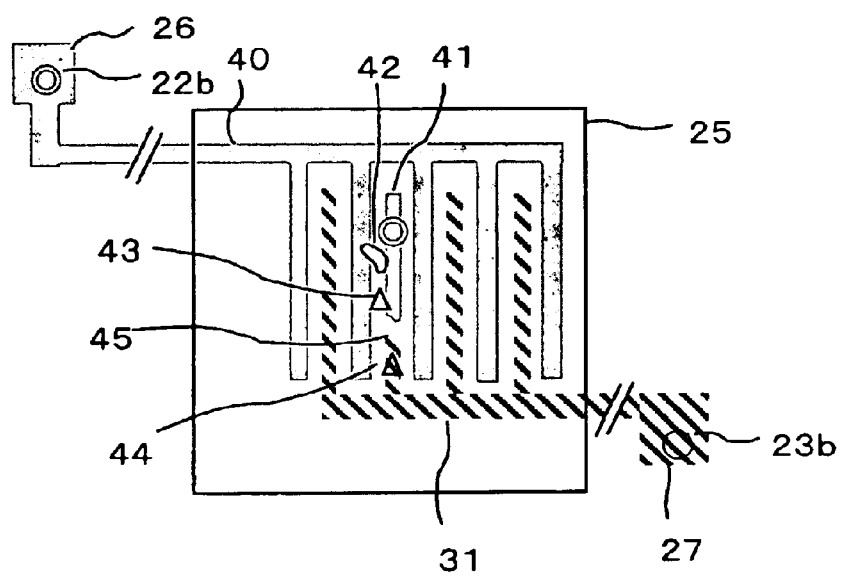
FIG. 11 is a view showing another example of a magnified inspection area image B of a wiring pattern TEG.

First, in FIG. 10, the pad 26 is originally a circuit pattern supposed to be conductive to all the wiring 28 to 30. Nevertheless, when a variety of electric voltage was applied to the pad 26 via the sample stage synchronous type conductor probe means 22 that was fixed to the sample stage 16 and voltage contrast SIM images were comparatively observed, the wiring 28 followed such variation of the voltage, but the wirings 29 and 30 did not. From SIM observation of a boundary at which the contrast was or was not followed, it was found out that a foreign particle 32 was creating a defect of wiring disconnection at that spot. Then, FIB processing was executed such that a slender triangle mark Δ 34 beside the spot of wiring disconnection as a landmark for a later FIB section process analysis indicates a direction of the defect. The x-y coordinates of the spot of defect were given by a total vector sum of the x-y coordinates of the sample stage 16, the x-y coordinates of beam shifting and the coordinates of the defect position within the visual field of the SIM image 25, and the coordinates were registered as position coordinates of the disconnection defect No. X being formed in a memory in the computer 18 after calculation with the computer 18. In the case where lid the section processing analysis is planned later, the SIM image for such defect was also registered as attached information.

Next, paying attention to the wirings 29 and 30, a tip portion of the fixed type conductor probe 21a that is fixed to the sidewall 20a of the sample chamber is mechanically contacted with the position 21b and electric potential from 0 to several volts is applied to the wiring, whereby voltage contrasts of SIM images were comparatively observed. Similarly to the foregoing description, it was observed that the wiring 29 followed variation of the electric potential, but the wiring 30 did not. Therefore, it was found out that another spot of disconnection 33 is present between the wirings 29 and 30. A landmark 35 for the FIB section processing analysis was also processed at that spot with the FIB. Next, a position of the tip portion of the fixed type conductor probe 21 is moved from 21b to 21b', and SIM images of voltage contrasts of the wiring 30 were comparatively observed in a similar manner. As a result of observation, it was found out that the wiring 30 did not contain any more spots of disconnection. In this way, disconnection defects of the wiring can be detected sequentially by comparative observation of the voltage contrasts of the SIM images while moving points of mechanical contacts of the conductor probe 21 with the wiring.

Next, an example of inspecting defects of short circuits existing in different positions on the sample from FIG. 10 will be described by use of FIG. 11. It is an example of electric potential contrasts of the SIM images of the wiring 41 interlocked with electric potential of the wiring 40, i.e. with variation of electric potential by the conductor probe means 22 to the pad 26, despite that the electric potential contrasts of the SIM images of the wiring 41 were supposed to interlock with electric potential of the wiring 31 to be conductive therewith, i.e. with variation of electric potential by the conductor probe means 23 to the pad 27. From comparative observation of voltage contrasts of this SIM image, it was found out that the wiring 41 is disconnected with the wiring 31 (at a spot of disconnection defect 45), and that a short-circuit defect is also present between the wiring 40 and the wiring 41, such short circuit being incurred by a foreign particle 42.

Figure 12:
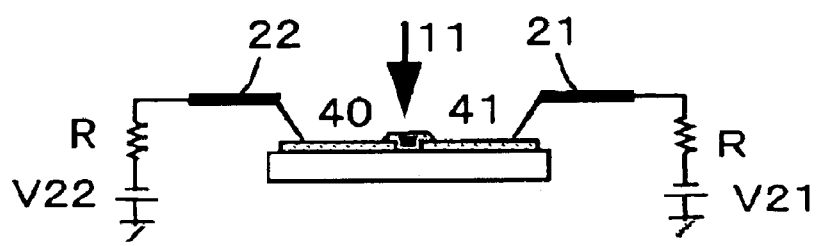
FIG. 12 is a schematic view of repair processing of a short-circuit defect in the wiring with the FIB (before processing).
Figure 13:
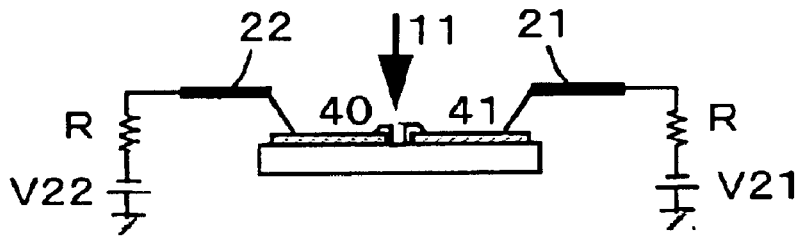
FIG. 13 is a schematic view of the repair processing of the short-circuit defect in the wiring with the FIB (after processing).

The short-circuit defect between the wiring 40 and the wiring 41 was repaired and confirmed as described below, an outline of which will be described by use of FIG. 12 and FIG. 13. FIG. 12 shows a state before processing and FIG. 13 shows a state after the processing.

As illustrated, the conductor probe means 22 and the conductor probe means 21 are electrically connected with the wiring 40 and the wiring 41, respectively. The conductor probe means 22 and the conductor probe means 21 were grounded via serial connections with direct current power sources having resistances R of the same resistance value and electric potential of $V_{22}$ and $V_{21}$, respectively. The direct resistance R is necessary for avoiding an overcurrent by the power source in the events of the conductor probe contacting with a pattern of different electric potential, or of grounding by movement due to malfunction. The values of the electric potential at the wiring 40 and the wiring 41 before and after a cutting process of the foreign particle 42, which is the cause of the short circuit, are organized in Table 1.

TABLE 1

| | Electric potential | |
|---|---|---|
| | Wiring 40 | Wiring 41 |
| Before processing | $(V_{22} + V_{21})/2$ | $(V_{22} + V_{21})/2$ |
| After processing | $V_{22}$ | $V_{21}$ |

Since the electric potential of the wiring 40 and that of the wiring 41 are identical when the wiring 40 and the wiring 41 are electrically connected, their electric potential contrasts are influenced by electric potential of the both power sources $V_{22}$ and $V_{21}$. On the contrary, when the cutting process is completed as shown in FIG. 13, the electric potential of the wiring 40 and the electric potential of the wiring 41 become coincident with the electric potential of the power source $V_{22}$ and the electric potential of the power source $V_{21}$, respectively. Accordingly, their electric potential contrasts are only influenced by either one of the electric potential of the power sources $V_{22}$ and $V_{21}$. Completion of the repairing process of the short-circuit defect was thus confirmed by experimental verification regarding changes in the above-described influences.

On the other hand, electric connection was achieved by a process of partial conductive film forming with FIB-assistive deposition with respect to the disconnection defect 45. In this example, $W(CO)_6$ was adopted as a material gas for deposition, and a tungsten (W) film was deposited in the portion of the disconnected defect. Completion of the repairing process of the disconnection defect was carried out as experimental verification regarding changes in the influences of the voltage contrasts similarly to the foregoing description. Moreover, regarding a pattern of floating electric potential that is not electrically connected with other places, electrified charges can be blown off by contacting the conductor probe of grounded electric potential, whereby information on variation of the voltage contrasts of the SIM image is also obtainable. Especially when patterns have periodicity in observation of the voltage contrasts of the SIM images, it is easy to visually identify positions of defects of disconnection or short circuits in the wiring or at the contact portions as periodical abnormalities of luminance of the pattern.

Defect inspection for devices is carried out with respect to a square size of about 20 to 25 mm that is equivalent to one chip, in a manner that the sample stage is moved by steps of a visual field size of SIM observation (a square of 1 to 2.5 mm at the maximum) for each. In this case, it is desirable that at least one tip of the conductor probes is always located within a maximum view field of SIM observation, from a viewpoint of improved efficiency of the above-described operations for confirming the defected positions and verifying completion of repairs. It is because the tip of the probe can be motion-controlled in short periods of time and with high positioning accuracy when a destination of the probe tip is always located within the visual field of an SIM image. The fixed type conductor probe means 21, which is relatively fixed to the FIB generator 10, is the probe means which corresponds to this demand. Meanwhile, regarding the conductor probe means for applying voltage to the pads on the sample surface irrelevantly to the movement of the sample stage, it is desired that such conductor probe means is sample stage synchronous type conductor probe means, which moves synchronously with the sample stage. In this way, defect inspection can be executed with good operability and high positioning accuracy, by choosing suitable means out of the fixed type conductor probe means and the sample stage synchronous type conductor probe means depending on objectives.

Among patterns to be contacted mechanically with the conductor probe, there are fine patterns (0.1 to 0.5 μm), relatively larger pads (1 to 5 μm) and the like. Contact with the fine patterns is carried out mostly for reconfirmation of discovered defects. Therefore, a moving range of the probe tip is as small as the range within the visual field of the SIM image (a square of 1 to 2.5 mm) and the contact requires high positioning accuracy by several tens of nanometers. On the contrary, contact with the relatively large pads (1 to 5 μm) is carried out for voltage application to TEG patterns. Therefore, regarding movement of the probe tip, it does not move asynchronously with the sample stage during inspection of one TEG, but it is required to move with respect only to inspection of other TEGs. A moving range thereof is as large as one chip (a square of about 20 to 25 mm), however, its positioning accuracy is as easy as a submicron level because of large sizes of pad patterns. For this reason, the present invention allotted the fixed type probe means capable of motion controlling with high positioning accuracy to the former probe means for contact, and the sample stage synchronous type probe means capable of motion controlling in a wide range to the latter probe means for contact.

Next, by use of FIGS. 14 to 18, description will be made regarding an example of a method of defect inspection for devices using judgment means as whether or not intensity of a luminance signal of an SIM image in a certain position on a conductive pattern varies in conjunction with a signal of voltage to be applied to the conductive pattern.

Figure 14:
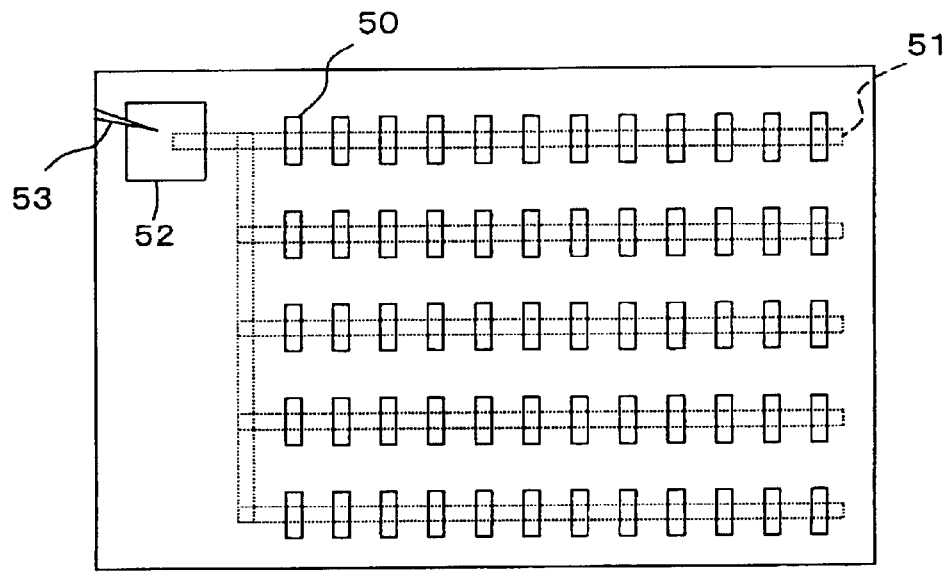
FIG. 14 is a view showing an example of an SIM image of a device on which conductive patterns are repeatedly disposed.
Figure 15:
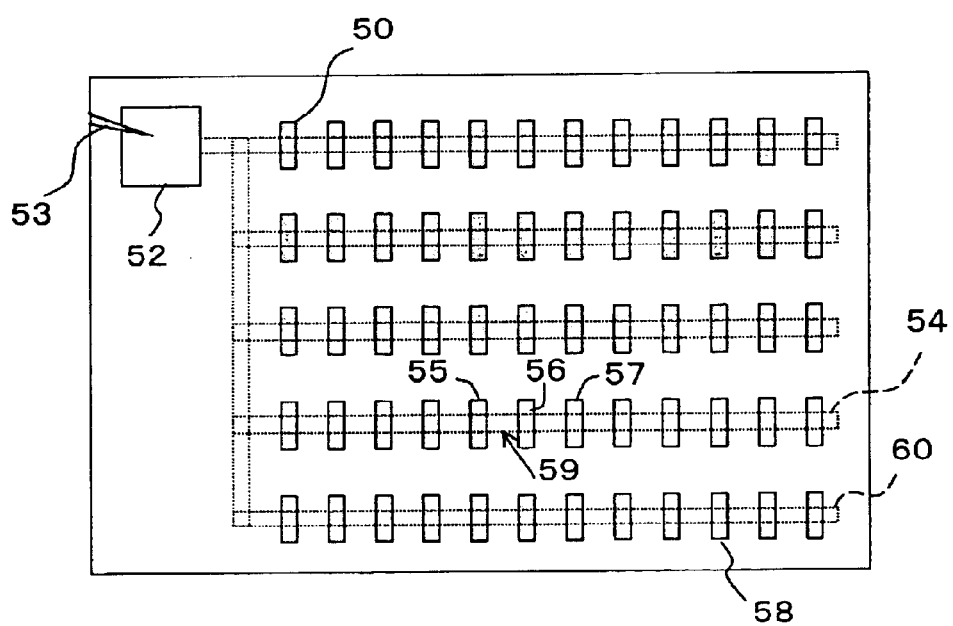
FIG. 15 is another view showing the example of the SIM image of the device on which conductive patterns are repeatedly disposed.

FIG. 14 and FIG. 15 are SIM images of a device on which conductive patterns 50 are repeatedly disposed. All the repeated patterns 50 were fabricated to have the same electric potential as that of a pad pattern 52, via underlayered wiring 51. FIG. 14 is an SIM image of a state 'a' wherein ground potential of a substrate of the device is set to Vs, a conductor probe 53 is contacted with a pad pattern 52, and electric potential of the conductor probe 53 is set identical to the ground potential Vs of the substrate. FIG. 15 is an SIM image where the state of FIG. 14 is shifted in a manner that the electric potential of the conductor probe 53 is shifted from the state 'a' of the ground potential Vs to a state 'b' in which the electric potential is set as Vs+Vt. For example, Vs is 0 V and Vt is 10 V.

In comparison of the SIM image in FIG. 15 with the SIM image in FIG. 14, whereas a majority of the intensity of the luminance signals of the repeated conductive patterns varies in conjunction with the voltage applied to the pad pattern 52, the conductive patterns starting a conductive pattern 56 located halfway on the fourth column toward the right direction do not interlock therewith. In other words, it is found out that underlayered wiring 54 on the fourth column has disconnection in a region 59 between a conductive pattern 55 and the conductive pattern 56. Similarly, in the case of a conductive pattern 58 on the fifth column, variation of the patterns on the column in the left and the right of the conductive pattern 58 interlock with the voltage applied to the pad pattern 52. Accordingly, presence of disconnection was identified at a contact portion between the conductive pattern 58 and underlayered wiring 60 on the fifth column.

Figure 16:
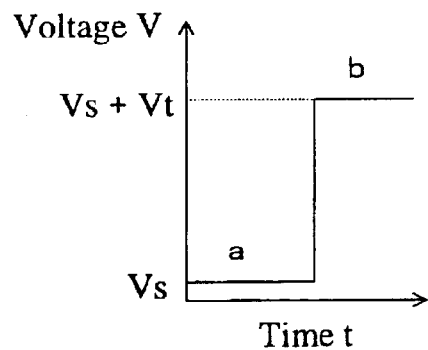
FIG. 16 is an explanatory drawing of a voltage signal to be applied to a pad pattern.
Figure 17:
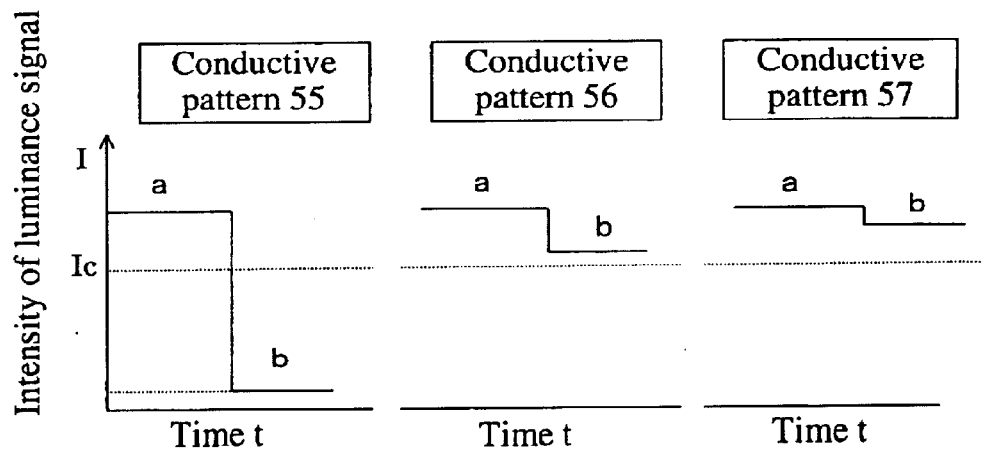
FIG. 17 is an explanatory drawing of intensity I of luminance signals I of conductive patterns 55 to 57.
Figure 18:
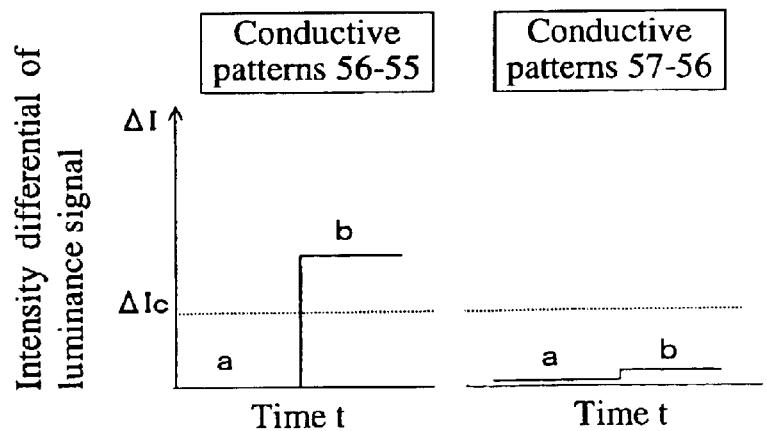
FIG. 18 is an explanatory drawing of intensity differential ΔI of luminance signals between adjacent conductive patterns.

FIG. 16, FIG. 17 and FIG. 18 are views concerning FIG. 14 and FIG. 15, respectively showing: the voltage applied to the pad pattern 52 in the state 'a' and the state 'b'; intensity I of the luminance signals of respective conductor patterns 55 to 57 in the state 'a' and the state 'b'; and intensity differential ΔI of the luminance signals between the conductive patterns 56 and 55, and between the conductive patterns 57 and 56, severally in the state 'a' and the state 'b'.

In FIG. 17, threshold intensity Ic of the luminance signal for judging is set on the intensity signal I, and presence or absence of code inversion of a value (I–Ic) in the state 'a' and the state 'b' was adopted as judgment means. In the conductive pattern 55 the codes in the state 'a' and the state 'b' are+and–, respectively, that is, the code inversion is occurring. On the contrary, in the conductive patterns 56 and 57, the codes in the state 'a' and the state 'b' are all +, that is, the code inversion is not occurring in either case. Therefore, it is found out that the conductive patterns 56 and 57 are electrically disconnected with the pad pattern 52.

However, when the repeated conductive patterns become dense, the electric potential of an adjacent pattern comes to influence I. For example, a feeble variation interlocking with the voltage applied to the pad pattern 52 occurs in I of the conductive patterns 56 and 57 being of floating electric potential due to the disconnection defect (differences of I observed in the conductive pattern 56 of FIG. 17 between the state 'a' and the state 'b'). Such influence from the electric potential of the adjacent pattern narrows allowances for a setting standard of Ic at the above-described code inversion. As a remedy of the influence, code inversion of an intensity differential ΔI of luminance signals between the adjacent patterns in the state 'a' and the state 'b' is adopted as new judgment means (see FIG. 18). The intensity differential ΔI of the luminance signals between the conductive patterns 56 and 55 shows code inversion, thus effectuating judgment that either one of the conductive patterns does not vary in conjunction with the voltage applied to the pad pattern 52. Since it has been made clear from an observation result of another SIM image that the conductive pattern 55 interlocks with the voltage applied to the pad pattern 52, it is predicable of disconnection of the conductive pattern 56 with the underlayered wiring 54. Meanwhile, the intensity differential of the luminance signals between the conductive patterns 57 and 56 does not show the code inversion, which indicates that the both conductive patterns vary in conjunction with the applied voltage, or neither of them does. Since it has been made clear for the previous data that the conductive pattern 56 is disconnected with the underlayered wiring 60, it leads to judgment that the conductive pattern 57 is also disconnected. In this new judgment means, $|\Delta I_a - \Delta I_b|/\Delta I_c$ in the conductive patterns 57–56 of FIG. 18 becomes as small by ⅓ to ⅒ as $|I_a - I_b|/I_c$ in the conductive pattern 56 of FIG. 17. Accordingly, it is made clear that the new judgment means succeeds in greatly reducing the above-described influence from the adjacent pattern.

Moreover, if a relational curve between luminance signal intensity of a pattern for inspection in electric potential contrast images and interconnection resistance to surrounding portions of the pattern is produced prior to inspection, such interconnection resistance can be estimated out of the intensity of the luminance signal of the pattern upon inspection.

The defects thus detected can be subjected to section processing with the FIB onto such defected positions, and to SIM observation of such sections, or to observation with a scanning electron microscope (SEM) or a transmission electron microscope (TEM), whereby factors such as disconnection, short circuits, foreign particles and abnormal structures can be analyzed with high resolving power.

Industrial Applicability of the Invention

As described above, according to the present invention, an apparatus for inspecting defects of devices meeting the demand for movements both in a wide-range and a arrow-range with high positioning accuracy and with good operability that effectuates improvements in inspection efficiency, and a method of inspecting defects can be provided.

What is claimed is:

1. An apparatus for inspecting defects of devices including: a sample chamber; a movable sample stage for holding a device sample inside the sample chamber; a focused ion beam generator for irradiating a focused ion beam having a deflection range on the sample held on the sample stage; a charged particle detector for detecting secondary charged particles generated from the sample by irradiation of the focused ion beam; an image display unit for displaying an observation image A in which detected intensity of the secondary charged particles is converted into luminance signals; and a plurality of conductor probes, to which voltage is applied, for contacting with the sample and conductor probe movement mechanisms for moving the conductor probes, wherein the plurality of conductor probes comprises:
a conductor probe that moves within the deflection range of the ion beam and is fixed relative to the focused ion beam generator; and
a conductor probe that moves in synchronization with the sample stage and is fixed relative to the sample stage.

2. The apparatus for inspecting defects of devices according to claim 1, wherein the conductor probe fixed relative to the focused ion beam generator can be moved with a higher positioning accuracy than the conductor probe fixed relative to the sample stage.

3. The apparatus for inspecting defects of devices according to any one of claims 1 and 2, wherein a conductor probe movement mechanism for the conductor probe fixed relative to the focused ion beam generator is fixed to any one of a sidewall face of the sample chamber, a ceiling face of the sample chamber and the focused ion beam generator, and
a conductor probe movement mechanism for the conductor probe fixed relative to the sample stage is fixed to the sample stage.

4. An apparatus for inspecting defects of devices including: a sample chamber; a movable sample stage for holding a device sample inside the sample chamber; a focused ion beam generator for irradiating a focused ion beam having a deflection range on the sample held on the sample stage; a charged particle detector for detecting secondary charged particles generated from the sample by irradiation of the focused ion beam; an image display unit for displaying an observation image A in which detected intensity of the secondary charged particles is converted into luminance signals; and a plurality of conductor probes, to which voltage is applied, for contacting with the sample and conductor probe movement mechanisms for moving the conductor probes, wherein the plurality of conductor probes comprises:
a conductor probe that moves within the deflection range of the ion beam and is fixed relative to the focused ion beam generator; and
a conductor probe that moves in synchronization with the sample stage and is fixed relative to the sample stage; and
wherein the apparatus includes a function of consistently locating the tip of the conductor probe fixed relative to the focused ion beam generator within a visual field of the observation image A.

5. The apparatus for inspecting defects of devices according to claim 4, wherein the image display unit displays an inspection area image B that indicates positions of the tips of the conductor probes on the sample.

6. The apparatus for inspecting defects of devices according to claim 5, wherein mechanical contact and non-contact of the tips of the conductor probes with the sample are displayed in the inspection area image B.

7. The apparatus for inspecting defects of devices according to any one of claims 5 and 6, wherein a state of spatial interference among the plurality of conductor probes is displayed in the inspection area image B.

8. A method of inspecting defects in devices including the steps of allowing a plurality of conductor probes to contact a device sample being held on a sample stage, irradiating a focused ion beam from a focused ion beam generator to the sample in a state that voltage is applied from the conductor probes to the sample, and detecting wiring defects based on voltage contrasts in an image taken with a scanning ion microscope by detecting secondary charged particles generated from the sample, wherein voltage application is carried out from a conductor probe, which is held in a position fixed relative to the focused ion beam generator and moves within the deflection range of the ion beam, to a voltage application point necessary to be changed in relation with movement of a visual field of the scanning ion microscope, and voltage application is carried out from a conductor probe, which is held at the sample stage and moves in synchronization with the sample stage, to a voltage application point not to be changed necessarily in relation with the movement of the visual field of the scanning ion microscope.

9. The method of inspecting defects in devices according to claim 8, wherein the tip of the conductor probe held in the position fixed relative to the focused ion beam generator is allowed to move as linked with the visual field of the scanning ion microscope.

10. The method of inspecting defects in devices according to any one of claims 8 and 9, wherein the position of the tip of the conductor probe is displayed as a mark superimposed on an image with the scanning ion microscope, and the displayed position of the mark is moved relatively to the image with the scanning ion microscope to enable the position of the tip of the conductor probe to be moved corresponding to the movement.

* * * * *

UNITED STATES PATENT AND TRADEMARK OFFICE
CERTIFICATE OF CORRECTION

PATENT NO.  : 6,734,687 B1
DATED       : May 11, 2004
INVENTOR(S) : Tohru Ishitani et al.

It is certified that error appears in the above-identified patent and that said Letters Patent is hereby corrected as shown below:

<u>Title page, Item [54] and Column 1, lines 1-3,</u>
Please change the title to:
-- APPARATUS FOR INSPECTING DEFECTS OF DEVICES AND METHOD OF INSPECTING DEFECTS --

Signed and Sealed this

First Day of February, 2005

JON W. DUDAS
*Director of the United States Patent and Trademark Office*